US010768768B2

(12) United States Patent
Chen

(10) Patent No.: US 10,768,768 B2
(45) Date of Patent: Sep. 8, 2020

(54) ARRAY SUBSTRATE AND DISPLAY PANEL

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/317,574

(22) PCT Filed: Sep. 12, 2018

(86) PCT No.: PCT/CN2018/105277
§ 371 (c)(1),
(2) Date: Jan. 14, 2019

(87) PCT Pub. No.: WO2020/037738
PCT Pub. Date: Feb. 27, 2020

(65) Prior Publication Data
US 2020/0117300 A1  Apr. 16, 2020

(51) Int. Cl.
*G06F 3/047* (2006.01)
*G06F 3/041* (2006.01)
(Continued)

(52) U.S. Cl.
CPC ............ *G06F 3/047* (2013.01); *G06F 3/0412* (2013.01); *G06F 3/04164* (2019.05);
(Continued)

(58) Field of Classification Search
CPC .... G06F 3/04164; G06F 3/047; G06F 3/0412;
G06F 3/044; G06F 3/041; G06F 3/04144;
G06F 3/03; G06F 3/01; G06F 3/00; G06F
3/0443; G06F 2203/04103; H01L
27/1288; H01L 27/124; H01L 27/1248;
H01L 29/78633; H01L 29/78675; H01L
27/1214; H01L 27/27; H01L 27/12; H01L
27/02; H01L 27/00; H01L 29/78672;
H01L 29/7866; H01L 29/78651; H01L
29/786; H01L 29/78; H01L 29/29; H01L
29/772;
(Continued)

(56) References Cited

U.S. PATENT DOCUMENTS 9,335,875 B2 *  5/2016  Noguchi ............. G02F 1/13338
2015/0287751 A1 * 10/2015  Jin ........................ H01L 27/124
                                                                 438/23
(Continued)

FOREIGN PATENT DOCUMENTS

CN      107229153      10/2017
CN      107305447      10/2017

*Primary Examiner* — Julie Anne Watko

(57) ABSTRACT

An array substrate and a display panel are disclosed. The array substrate includes a first common electrode, a plurality of touch sensing electrode wires, and a second common electrode. The first common electrode includes at least two first common electrode plates, each of the touch sensing electrode wires includes at least two discontinuous electrode lines, and each of the electrode lines corresponds to one of the first common electrode plates, wherein two adjacent of the electrode lines are electrically connected via the second common electrode plate.

12 Claims, 4 Drawing Sheets

(51) Int. Cl.
 *G06F 3/044* (2006.01)
 *H01L 27/12* (2006.01)
 *H01L 29/786* (2006.01)

(52) U.S. Cl.
 CPC ........ *H01L 27/124* (2013.01); *H01L 27/1248* (2013.01); *G06F 3/044* (2013.01); *G06F 3/0443* (2019.05); *G06F 2203/04103* (2013.01); *H01L 27/1288* (2013.01); *H01L 29/78633* (2013.01); *H01L 29/78675* (2013.01)

(58) Field of Classification Search
 CPC ......... H01L 29/76; H01L 29/68; H01L 29/66; H01L 29/66007; H01L 29/00; H01L 27/1218; H01L 27/1259
 See application file for complete search history.

(56) References Cited

U.S. PATENT DOCUMENTS

| | | | |
|---|---|---|---|
| 2016/0259444 A1* | 9/2016 | Yang | G06F 3/044 |
| 2017/0003786 A1 | 1/2017 | Kim et al. | |
| 2017/0031489 A1* | 2/2017 | Kim | H01L 27/124 |
| 2017/0160845 A1 | 6/2017 | Lee et al. | |
| 2017/0205953 A1* | 7/2017 | Sun | G09G 3/3648 |
| 2017/0207251 A1* | 7/2017 | Liu | H01L 27/1222 |
| 2017/0228065 A1* | 8/2017 | Lee | G06F 3/044 |
| 2017/0300160 A1* | 10/2017 | Tsai | G06F 3/0412 |
| 2019/0302555 A1* | 10/2019 | Tang | G06F 3/04164 |
| 2019/0391691 A1* | 12/2019 | Zhou | G06F 3/04164 |

* cited by examiner

ARRAY SUBSTRATE AND DISPLAY PANEL

RELATED APPLICATIONS

This application is a National Phase of PCT Patent Application No. PCT/CN2018/105277 having International filing date of Sep. 12, 2018, which claims the benefit of priority of Chinese Patent Application No. 201810955534.8 filed on Aug. 21, 2018. The contents of the above applications are all incorporated by reference as if fully set forth herein in their entirety.

FIELD AND BACKGROUND OF THE INVENTION

The present disclosure relates to the technical field of displays, and specifically to an array substrate and a display panel.

As an important indicator of intelligence, touch technology is more and more widely used. Touch technology has been rapidly developed, and can be divided into piezo-resistive, optical, and capacitive based on touch principle. Among them, the capacitive touch technology has been developed for many generations and is the most widely used.

In structure of low temperature poly-silicon (LTPS) products, the capacitive touch technology can be roughly divided into add-on touch, on-cell touch, and in-cell touch. Compared with non in-cell touch (ICP), the ICP only requires a two layered structure, that is, a touch sensing electrode and a touch insulation layer. However, LTPS process is complicated. In an array process, more layers of a substrate are formed into the array. Generally, a layered structure of 10 layers or more is required. More photomasks lead to increased production time, increased lighting costs, and operating costs.

Therefore, the present disclosure proposes a novel structure based on this technical problem.

SUMMARY OF THE INVENTION

The present application provides an array substrate and a display panel to solve a technical problem that array substrate process in the prior art is complicated.

In order to solve the above problem, technical solutions provided by the present disclosure are as follows.

The present application provides an array substrate, which includes:
a substrate;
a first common electrode located on the substrate, wherein the first common electrode includes at least two first common electrode plates, which are arranged in an array manner and insulated each other;
a second common electrode located on the first common electrode; and
a plurality of touch sensing electrode wires formed on the first common electrode and electrically connected to the first common electrode;
wherein each of the touch sensing electrode wires includes at least two discontinuous electrode lines, and each of the electrode lines corresponds to one of the first common electrode plates.

In the array substrate of the present disclosure, each of the first common electrode plates corresponds to at least one of the touch sensing electrode wires.

In the array substrate of the present disclosure, the second common electrode includes at least one second common electrode plate, and two adjacent of the electrode lines are electrically connected via the second common electrode plate.

In the array substrate of the present disclosure, the touch sensing electrode wires and the first common electrode are formed by a same photomask process.

In the array substrate of the present disclosure, orthographic projections of the touch sensing electrode wires on the first common electrode plates are projected within the first common electrode plates.

The present application further provides an array substrate, which includes:
a substrate;
a first common electrode located on the substrate;
a second common electrode located on the first common electrode; and
a plurality of touch sensing electrode wires formed on the first common electrode and electrically connected to the first common electrode.

In the array substrate of the present disclosure, the first common electrode comprises at least two first common electrode plates arranged in an array manner and insulated each other, and each of the first common electrode plates corresponds to at least one of the touch sensing electrode wires.

In the array substrate of the present disclosure, each of the touch sensing electrode wires includes at least two discontinuous electrode lines.

In the array substrate of the present disclosure, the second common electrode includes at least one second common electrode plate, and two adjacent of the electrode lines are electrically connected via the second common electrode plate.

In the array substrate of the present disclosure, which includes a plurality of first via holes, wherein the second common electrode plate is electrically connected to the electrode lines through the first via holes.

In the array substrate of the present disclosure, which further includes a plurality of second via holes, wherein a portion of the second common electrode is electrically connected to a plurality of sources or a plurality of drains in the array substrate through the second via holes.

In the array substrate of the present disclosure, the first via holes pass through a planarization layer of the array substrate, and the second via holes pass through a passivation layer of the array substrate and a portion of the planarization layer.

In the array substrate of the present disclosure, the touch sensing electrode wires and the first common electrode are formed by a same photomask process.

In the array substrate of the present disclosure, orthographic projections of the touch sensing electrode wires on the first common electrode plates are projected within the first common electrode plates.

The present application provides a display panel, which includes an array substrate, wherein the array substrate includes:
a substrate;
a first common electrode located on the substrate;
a second common electrode located on the first common electrode; and
a plurality of touch sensing electrode wires formed on the first common electrode and electrically connected to the first common electrode.

In the display panel of the present disclosure, the first common electrode includes at least two first common electrode plates arranged in an array manner and insulated each other, and each of the first common electrode plates corresponds to at least one of the touch sensing electrode wires.

In the display panel of the present disclosure, each of the touch sensing electrode wires includes at least two discontinuous electrode lines.

In the display panel of the present disclosure, the second common electrode includes at least one second common electrode plate, and two adjacent of the electrode lines are electrically connected via the second common electrode plate.

In the display panel of the present disclosure, the touch sensing electrode wires and the first common electrode are formed by a same photomask process.

In the display panel of the present disclosure, orthographic projections of the touch sensing electrode wires on the first common electrode plates are projected within the first common electrode plates.

Beneficial effect: the present disclosure simultaneously forms the touch sensing electrode wires and the first common electrode by a photomask process, which saves a number of photomasks, effectively reduces cycle in a panel array manufacturing process, and reduces manufacturing cost.

BRIEF DESCRIPTION OF THE SEVERAL VIEWS OF THE DRAWINGS

In order to more clearly illustrate technical solutions in the present embodiments or the prior art, drawings used in a description of the embodiments or the prior art will be briefly described below. Obviously, the drawings in the following description are merely some embodiments of the present disclosure, and other drawings may be obtained from those skilled in the art without any creative work.

DESCRIPTION OF SPECIFIC EMBODIMENTS OF THE INVENTION

Figure 1:
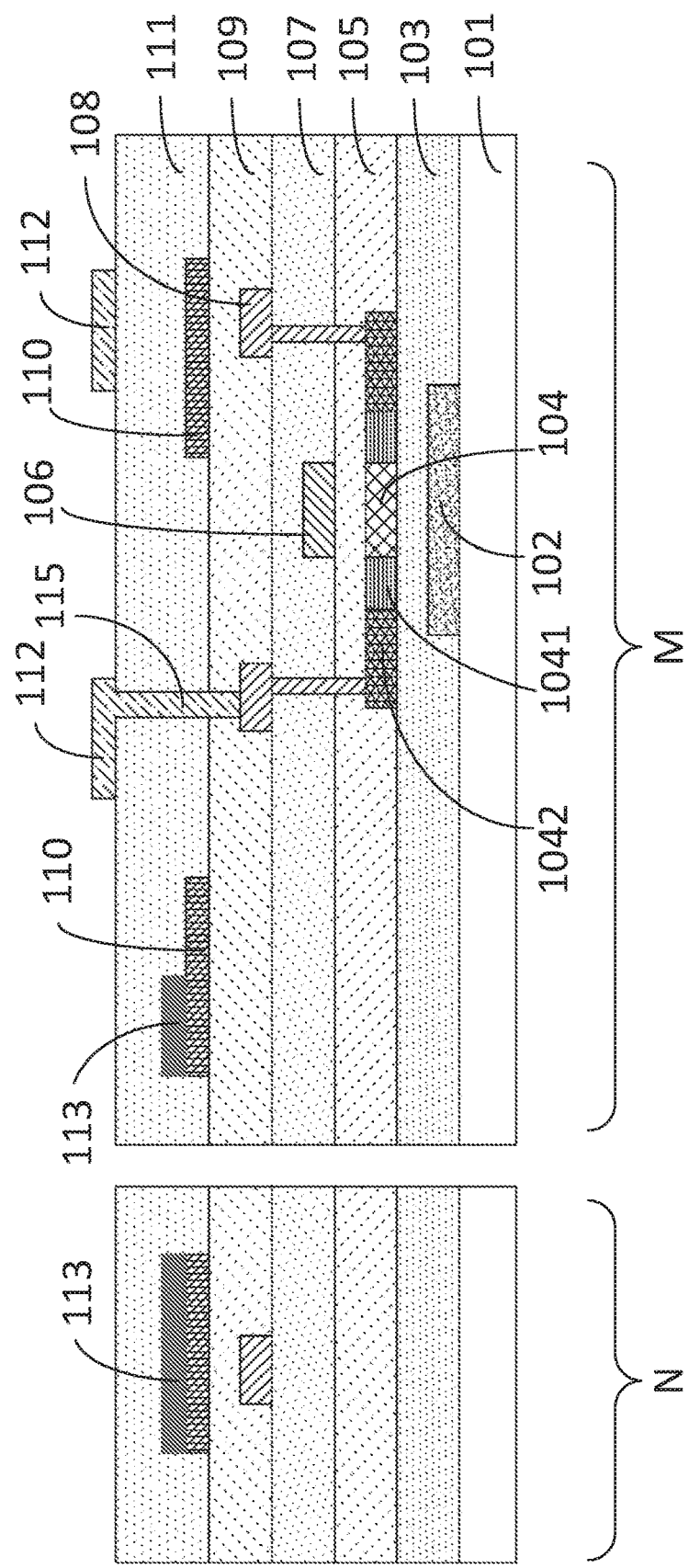
FIG. 1 is a schematic diagram of a layered structure of an array substrate according to an embodiment of the present disclosure.

The following description of each embodiment refers to the appended drawings for illustrating specific embodiments, in which the present disclosure may be practiced. Directional terms as mentioned in the present disclosure, such as "up", "down", "front", "rear", "left", "right", "inside", "outside", "lateral", etc., are merely used for the purpose of illustrating and understanding the present disclosure and are not intended to be limiting of the present disclosure. In the drawings, units with similar structures are denoted by the same reference numerals.

Referring FIG. 1, which is a schematic diagram of a layered structure of an array substrate according to an embodiment of the present disclosure.

The array substrate includes a substrate 101, a thin film transistor layer located on the substrate 101, a planarization layer 109 located on the thin film transistor layer, a first common electrode 110 located on the planarization layer 109, a plurality of touch sensing electrode wires 113 located on the first common electrode 110, a passivation layer 111 located on the touch sensing electrode wires 113, and a second common electrode 112 located on the passivation layer 111.

In one embodiment, a region M is a display region and a region N is a non-display region.

In one embodiment, the thin film transistor layer includes a light shielding layer 102, a buffer layer 103, a silicon channel layer 104, a first insulation layer 104, a plurality of gates 106, a second insulation layer 107, a plurality of sources and drains 108, and some via holes.

In one embodiment, a raw material of the substrate 101 may be one of a glass substrate, a quartz substrate, or a resin substrate.

The light shielding layer 102 is formed on the substrate 101. The light shielding layer 102 may be, but not limited to, a black light shielding material.

The buffer layer 103 is formed on the light shielding layer 102, and covers the light shielding layer 102

The silicon channel layer 104 is formed on the buffer 103. The silicon channel layer 104 may be composed of polysilicon. The silicon channel layer 104 includes a lightly doped region 1041 and a heavily doped region 1042 that are ion-doped. The heavily doped region 1042 is located on two sides of the silicon channel layer 104. The lightly doped region 1041 is located between the silicon channel layer 104 that is not an ion-doped, and the heavily doped region 1042. The heavily doped region 1042 is implanted with a high concentration of N+ ions, and the lightly doped region 1041 is implanted with a low concentration of N− ions.

The first insulation layer 105 is formed on the silicon channel layer 104. The first insulation layer 105 is a gate insulation layer, which covers the silicon channel layer 104. The gate insulation layer is mainly used to isolate the silicon channel layer 104 from other metal layers. In one embodiment, a material of the gate insulation layer may be silicon nitride, and may also be silicon oxide, silicon oxynitride, and the like.

The gate electrode 106 is formed on the first insulation layer 105. A metallic material of the gate electrode 106 may generally be a metal, such as molybdenum, aluminum, an aluminum-nickel alloy, a molybdenum-tungsten alloy, chromium, or copper, and may also be a combination of the above-mentioned metal materials.

In one embodiment, the metal material of the gate 106 may be molybdenum.

A photoresist layer is formed on the metal layer by using a first photomask process to a metal layer forming the gate electrode 106. After a composition process of a mask exposure (not shown), development, and etching, the metal layer is formed to the gate electrode 106 of the array substrate as shown in FIG. 1, and the photoresist layer is peeled off.

The second insulation layer 107 is formed on the gate 106. The second insulation layer 107 is an inter-layered insulation layer, and the inter-layered insulation layer covers the gates 106. The inter-layered insulation layer is mainly used to isolate the gates 106 from the sources and drains 108.

The sources and drains 108 are formed on the second insulation layer 107. A metallic material of the sources and drains electrodes 108 may be generally a metal, such as molybdenum, aluminum, an aluminum-nickel alloy, a molybdenum-tungsten alloy, chromium, copper or a titanium-aluminum alloy, and may also be a combination of the above-mentioned metal materials. In one embodiment, the metal material of the sources and drains 108 may be a titanium-aluminum alloy.

A photoresist layer is formed on the metal layer by a second photomask process to a metal layer forming the sources and drains 108. After a composition process of a mask exposure (not shown), development, and etching, the metal layer is formed to the sources and drains 108 as shown in FIG. 1, and the photoresist layer is peeled off.

The planarization layer 109 is formed on the sources and drains 108. The planarization layer 109 covers the sources and drains 108, and is mainly used to ensure flatness of the layered structure.

The first common electrode 110 is formed on the planarization layer 109.

Figure 2:
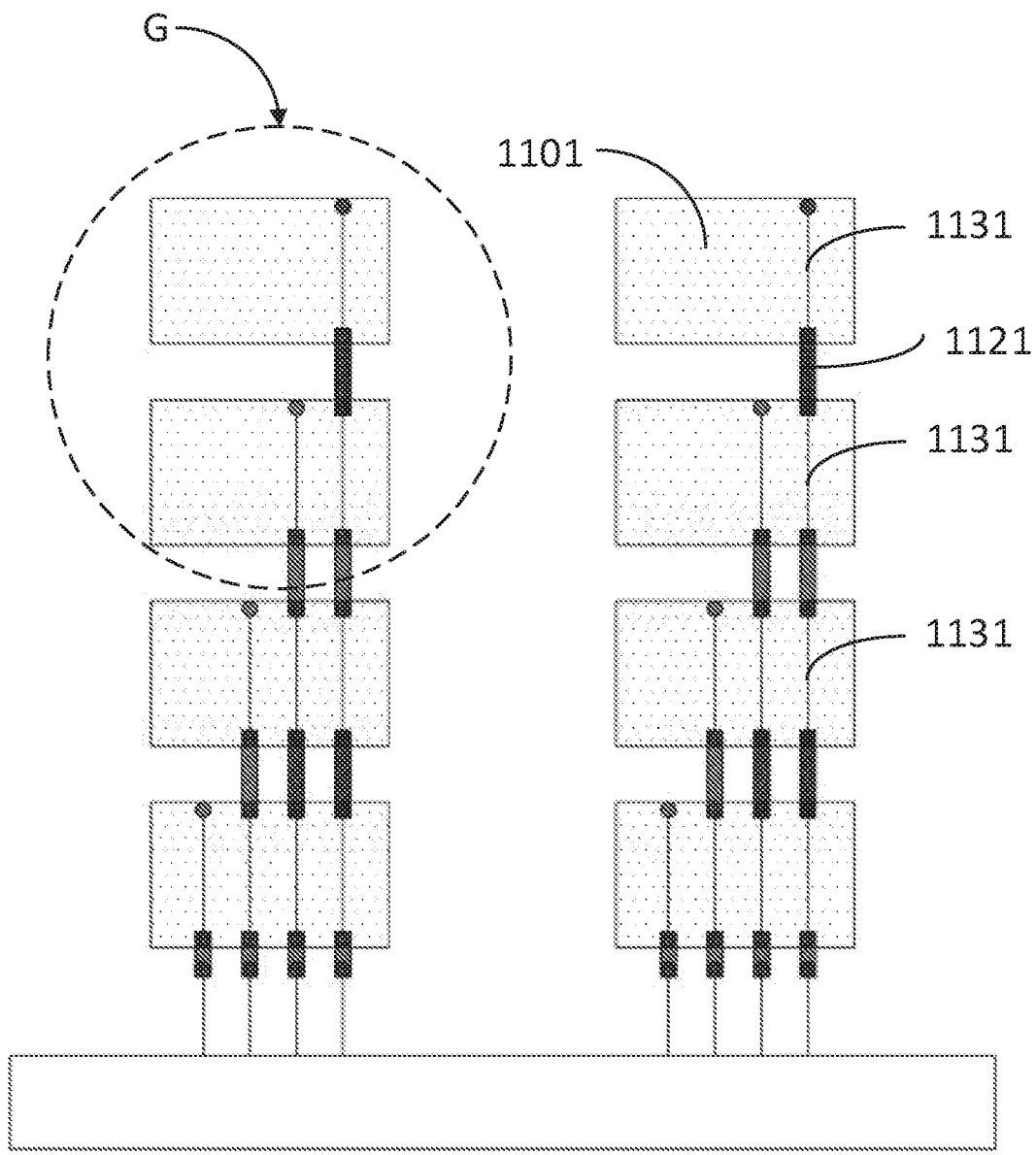
FIG. 2 is a top view of a touch layer of an array substrate according to an embodiment of the present disclosure.

Referring FIG. 2, which is a top view of a touch layer of an array substrate according to an embodiment of the present disclosure.

The first common electrode 110 includes a plurality of first common electrode plates 1101, which are arranged in an array manner and insulated each other. Each of the first common electrode plates 1011 corresponds to at least one of the touch sensing electrode wires 113. In one embodiment, each of the first common electrode plates 1011 corresponds to one of the touch sensing electrode wires 113.

The passivation layer 111 is formed on the first common electrode 110 for ensuring the flatness of the layered structure. In one embodiment, a material of the passivation layer 111 may be a tantalum nitride compound.

The second common electrode 112 is formed on the passivation layer 111. The second common electrode 112 may also be called as a pixel electrode. The first common electrode 110 and the second common electrode 112 provide a voltage, at which liquid crystal molecules are deflected.

Referring FIGS. 1 and 2, the array substrate includes a plurality of touch sensing electrode wires 113, which are formed on the first common electrode plate 1101. Each of the touch sensing electrode wires 113 includes at least two discontinuous electrode lines 1131.

In one embodiment, the second common electrode 112 includes at least one second common electrode plate 1121, and two adjacent of the electrode lines 1131 are electrically connected via the second common electrode plate 1121.

Figure 3:
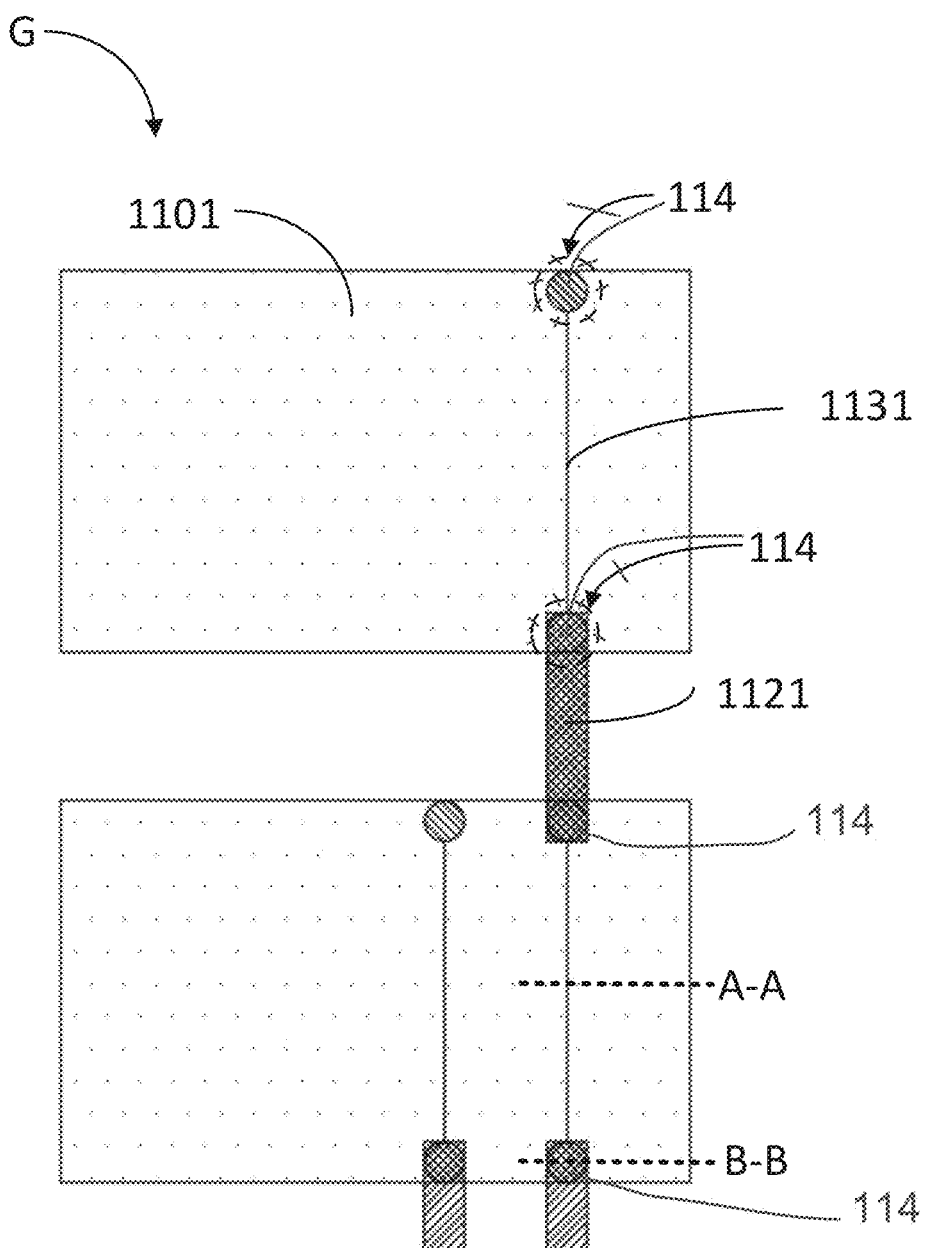
FIG. 3 is an enlarged view of a region G in FIG. 2.

Please refer to FIG. 3, which is an enlarged view of a region G in FIG. 2.

The array substrate includes a plurality of first via holes 114. The second common electrode plate 1121 is electrically connected to the electrode lines 1131 through the first via holes 114. Because each of the first common electrode plates 1101 and the electrode lines 1131 corresponded to each of the first common electrode plates 1101 are discontinuous, that is, insulated each other. Therefore, in the present disclosure, each of the first common electrode plates 1101 are connected to each other via the at least one second common electrode plate 1121. A touch signal on one of the first common electrode plates 1101 is transmitted to other first common electrode plates 1101 adjacent to the second common electrode plate 1121 via the second common electrode plate 1121. Finally, the touch signal is transmitted to a driving chip.

Figure 4:
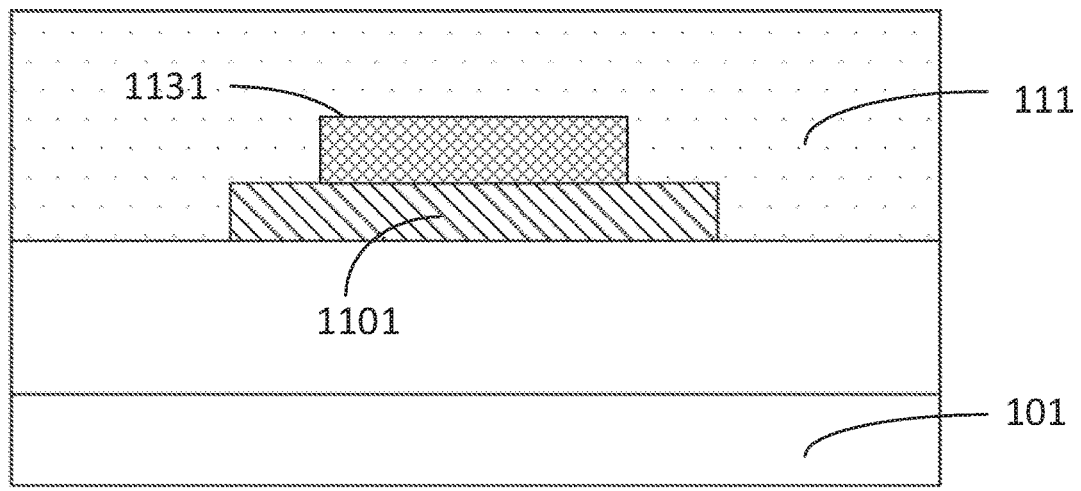
FIG. 4 is a schematic diagram of a layered structure of a first embodiment taken along line A-A in FIG. 3.

Please refer to FIG. 4, which is a schematic diagram of a layered structure of a first embodiment taken along line A-A in FIG. 3. The electrode lines 1131 are formed on the first common electrode plates 1101 and are arranged in parallel with the first common electrode plates 1101.

Figure 5:
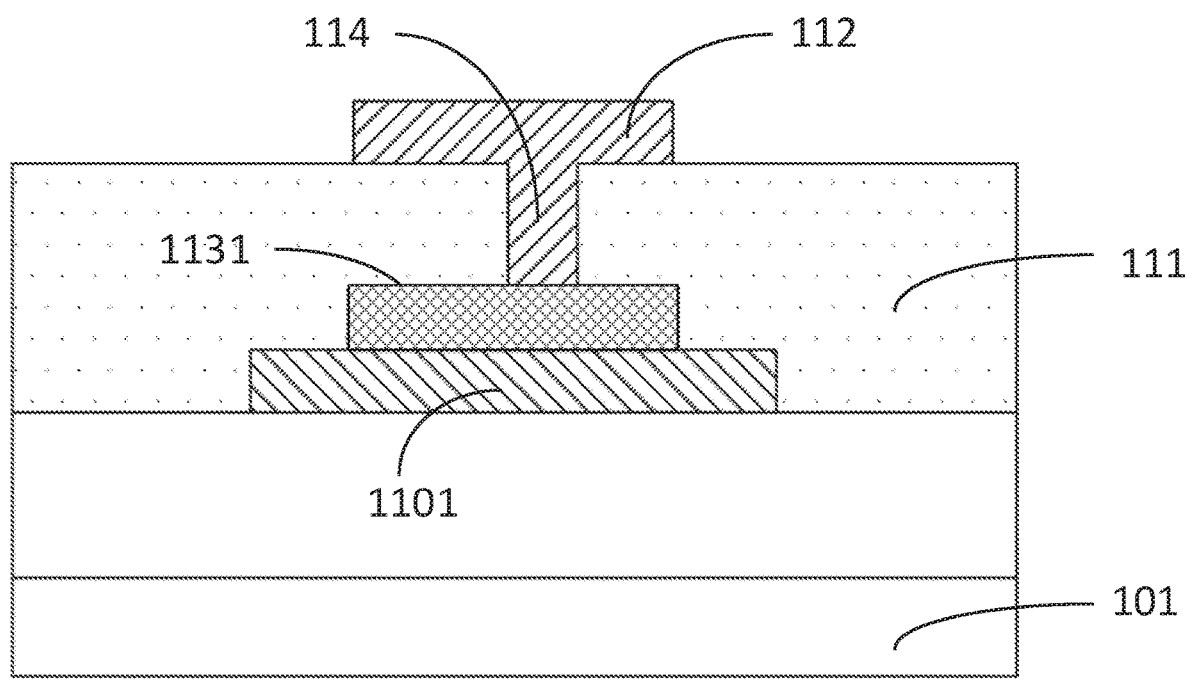
FIG. 5 is a schematic diagram of a layered structure of a second embodiment taken along line B-B in FIG. 3.

Please refer to FIG. 5, which is a schematic diagram of a layered structure of a second embodiment taken along line B-B in FIG. 3. The electrode lines 1131 are formed on the first common electrode plates 1101 and are arranged in parallel with the first common electrode plates 1101.

In one embodiment, the second common electrode plate 1121 is electrically connected to one of the electrode lines 1131 and/or one of the first common electrode plates 1101 via one of the first via holes 114. The two adjacent of the first common electrode plates 1101 are overlapped by the second common electrode plate 1121.

In one embodiment, please refer to FIG. 1, the array substrate further includes a plurality of second via holes 115. A portion of the second common electrode 112 is electrically connected to the sources or drains 108 in the array substrate through the second via holes 115.

In one embodiment, the first via holes 114 pass through the planarization layer 109, and the second via holes 115 pass through the passivation layer 111 and a portion of the planarization layer 109.

The touch sensing electrode wires 113 and the first common electrode 110 are formed by a single photomask of half tone mask (HTM) technology. That is, orthographic projections of the touch sensing electrode lines 1131 on the first common electrode plates 1101 corresponding to the touch sensing electrode lines 1131 are projected within the first common electrode plates 1101.

The present disclosure further provides a display panel, wherein the display device includes the above array substrate.

The present disclosure provides an array substrate and a display panel, the array substrate including a substrate, a first common electrode, a plurality of touch sensing electrode wires, and a second common electrode, wherein the first common electrode, the touch sensing electrode wires, and the second common electrode are located on the substrate, and the touch sensing electrode wires are firmed on the first common electrode; the first common electrode including at least two first common electrode plates, each of the touch sensing electrode wires includes at least two discontinuous electrode lines, and each of the electrode lines corresponds to one of the first common electrode plates; wherein two adjacent of the electrode lines are electrically connected via the second common electrode plate. The present disclosure simultaneously forms the touch sensing electrode wires and the first common electrode by a single photomask process, that saves a number of photomasks, effectively reduces cycle in a panel array manufacturing process, and reduces manufacturing cost.

In summary, although the present disclosure has been disclosed in the preferred embodiments, the above preferred embodiments are not intended to limit the present disclosure. Those skilled in the art may make various changes and modifications without departing from the spirit and scope of the present disclosure. Therefore, the protection scope of the present disclosure is based on the scope defined by the claims.

What is claimed is:

1. An array substrate, comprising:
   a substrate;
   a first common electrode located on the substrate, wherein the first common electrode comprises at least two first common electrode plates;
   a second common electrode located on the first common electrode, wherein the second common electrode comprises at least one second common electrode plate; and
   a plurality of touch sensing electrode wires formed on the first common electrode and electrically connected to the first common electrode;
   wherein each of the touch sensing electrode wires comprises at least one electrode line, each electrode line of the electrode line corresponds to one of the first common electrode plates, and two adjacent electrode lines are electrically connected via the second common electrode plate.

2. The array substrate as claimed in claim 1, wherein each of the first common electrode plates corresponds to at least one of the touch sensing electrode wires.

3. The array substrate as claimed in claim 1, wherein orthographic projections of the touch sensing electrode wires on the first common electrode plates are projected within the first common electrode plates.

4. An array substrate, comprising:
a substrate;
a first common electrode located on the substrate, wherein the first common electrode comprises at least two first common electrode plates arranged in an array manner and insulated each other;
a second common electrode located on the first common electrode, wherein the second common electrode comprises at least one second common electrode plate; and
a plurality of touch sensing electrode wires formed on the first common electrode and electrically connected to the first common electrode;
wherein each of the touch sensing electrode wires comprises at least one electrode line, each electrode line corresponds to one of the first common electrode plates, and two adjacent electrode lines are electrically connected via the second common electrode plate.

5. The array substrate as claimed in claim 4, wherein each of the first common electrode plates corresponds to at least one of the touch sensing electrode wires.

6. The array substrate as claimed in claim 4, further comprising a plurality of first via holes, wherein the second common electrode plate is electrically connected to the electrode lines through the first via holes.

7. The array substrate as claimed in claim 6, further comprising a plurality of second via holes, wherein a portion of the second common electrode is electrically connected to a plurality of sources or a plurality of drains in the array substrate through the second via holes.

8. The array substrate as claimed in claim 7, wherein the first via holes pass through a planarization layer of the array substrate, and the second via holes pass through a passivation layer of the array substrate and a portion of the planarization layer.

9. The array substrate as claimed in claim 4, wherein orthographic projections of the touch sensing electrode wires on the first common electrode plates are projected within the first common electrode plates.

10. A display panel, comprising an array substrate comprising:
a substrate;
a first common electrode located on the substrate, wherein the first common electrode comprises at least two first common electrode plates;
a second common electrode located on the first common electrode, wherein the second common electrode comprises at least one second common electrode plate; and
a plurality of touch sensing electrode wires formed on the first common electrode and electrically connected to the first common electrode;
wherein each of the touch sensing electrode wires comprises at least one electrode line, each electrode line corresponds to one of the first common electrode plates, and two adjacent electrode lines are electrically connected via the second common electrode plate.

11. The display panel as claimed in claim 10, wherein the first common electrode plates are arranged in an array manner and insulated each other, and each of the first common electrode plates corresponds to at least one of the touch sensing electrode wires.

12. The display panel as claimed in claim 10, wherein orthographic projections of the touch sensing electrode wires on the first common electrode plates are projected within the first common electrode plates.

* * * * *

UNITED STATES PATENT AND TRADEMARK OFFICE
CERTIFICATE OF CORRECTION

PATENT NO. : 10,768,768 B2
APPLICATION NO. : 16/317574
DATED : September 8, 2020
INVENTOR(S) : Caiqin Chen Page 1 of 1

It is certified that error appears in the above-identified patent and that said Letters Patent is hereby corrected as shown below:

On the Title Page

Insert the following:
-- (30) *Foreign Application Priority Data*
Aug. 21, 2018 (CN)………………. 201810955534.8 --

Signed and Sealed this
Eighth Day of December, 2020

Andrei Iancu
*Director of the United States Patent and Trademark Office*